(12) United States Patent
Huminic et al.

(10) Patent No.: US 9,219,185 B2
(45) Date of Patent: Dec. 22, 2015

(54) CMOS INTEGRATED METHOD FOR THE FABRICATION OF THERMOPILE PIXEL WITH UMBRELLA ABSORBER ON SEMICONDUCTOR SUBSTRATE

(71) Applicant: Excelitas Technologies Singapore Pte. Ltd., Solaris South Tower (SG)

(72) Inventors: Grigore D. Huminic, Bale D'Urfe (CA); Philippe Vasseur, Lachine (CA); Hermann Karagoezoglu, Wiesbaden (DE); Radu M. Marinescu, Pointe-Claire (CA)

(73) Assignee: Excelitas Technologies Singapore Pte. Ltd, Singapore (SG)

( * ) Notice: Subject to any disclaimer, the term of this patent is extended or adjusted under 35 U.S.C. 154(b) by 0 days.

(21) Appl. No.: 14/134,531

(22) Filed: Dec. 19, 2013

(65) Prior Publication Data

US 2015/0179864 A1    Jun. 25, 2015

(51) Int. Cl.
*H01L 21/8238* (2006.01)
*H01L 31/18* (2006.01)
(Continued)

(52) U.S. Cl.
CPC ............... *H01L 31/18* (2013.01); *G01J 5/024* (2013.01); *G01J 5/0225* (2013.01); *G01J 5/12* (2013.01); *H01L 31/02* (2013.01)

(58) Field of Classification Search
CPC .............. H01L 21/02109; H01L 21/04; H01L 21/4814; H01L 21/70
See application file for complete search history.

(56) References Cited

U.S. PATENT DOCUMENTS

| 4,558,342 A | 12/1985 | Sclar |
| 5,059,543 A | 10/1991 | Wise et al. |

(Continued)

FOREIGN PATENT DOCUMENTS

| DE | 4221037 A1 | 1/1994 |
| EP | 2416134 A1 | 2/2012 |

(Continued)

OTHER PUBLICATIONS

Frank Nikiaus et al; MEMS-Based Uncooled Infrared Bolometer Arrays—A Review; from conference vol. 6836, Nov. 11, 2007 in Beijing China; Proc. SPIE 6836, MEMS/MOEMS Technologies and Applications III, 68360D (Jan. 4, 2008); doi: 10.1117/12.755128.

(Continued)

*Primary Examiner* — Cheung Lee
(74) *Attorney, Agent, or Firm* — Peter A. Nieves; Sheehan Phinney Bass + Green PA

(57) ABSTRACT

A method of manufacturing a pixel structure having an umbrella absorber is disclosed. The method includes providing a substrate with a membrane on a first surface of the substrate. The membrane has one or more openings that expose one or more portions of the first surface, and includes a thermopile. A sacrificial layer is deposited on the membrane and in the one or more openings. The sacrificial layer is patterned to expose a portion of the membrane associated with one or more hot junctions of the thermopile. A rigid, thermally-conductive layer is formed on the sacrificial layer and on the exposed portion of the membrane associated with the one or more hot junctions of the thermopile. An absorber is deposited on the rigid, thermally-conductive layer. A cavity is formed in the substrate from a second surface of the substrate to the membrane and the sacrificial layer is removed.

21 Claims, 17 Drawing Sheets

(51) Int. Cl.
*G01J 5/02* (2006.01)
*G01J 5/12* (2006.01)
*H01L 31/02* (2006.01)

(56) References Cited

U.S. PATENT DOCUMENTS

| | | |
|---|---|---|
| 5,283,459 A | 2/1994 | Hirano et al. |
| 6,165,854 A | 12/2000 | Wu |
| 6,294,787 B1 | 9/2001 | Schieferdecker et al. |
| 6,339,187 B1 | 1/2002 | Inoue |
| 6,458,615 B1 | 10/2002 | Fedder et al. |
| 6,476,455 B2 | 11/2002 | Toyoda et al. |
| 6,518,597 B1 | 2/2003 | Kim |
| 6,552,344 B1 | 4/2003 | Sone et al. |
| 6,870,086 B2 | 3/2005 | Hamamoto et al. |
| 6,900,518 B2 | 5/2005 | Udrea et al. |
| 6,927,102 B2 | 8/2005 | Udrea et al. |
| 7,282,712 B2 | 10/2007 | Shibayama |
| 7,863,063 B2 | 1/2011 | Tan |
| 8,742,528 B2 | 6/2014 | Yamamura et al. |
| 8,758,650 B2 | 6/2014 | Marinescu et al. |
| 2004/0113076 A1 | 6/2004 | Guo et al. |
| 2004/0146810 A1 | 7/2004 | Gabriel et al. |
| 2004/0169144 A1 | 9/2004 | Shibayama |
| 2005/0178967 A1 | 8/2005 | Nakaki et al. |
| 2006/0060788 A1 | 3/2006 | Uchida et al. |
| 2009/0184402 A1 | 7/2009 | Chen |
| 2010/0289108 A1 | 11/2010 | Meinel et al. |
| 2011/0248374 A1 | 10/2011 | Akin |
| 2012/0037591 A1 | 2/2012 | Tringe et al. |
| 2013/0134542 A1 | 5/2013 | Lu et al. |
| 2013/0206989 A1* | 8/2013 | Zhou et al. .................. 250/338.1 |

FOREIGN PATENT DOCUMENTS

| | | |
|---|---|---|
| JP | H09-133578 A | 5/1997 |
| JP | 2012026861 A | 2/2012 |
| JP | 2012026934 A | 2/2012 |
| WO | WO9931471 | 6/1999 |
| WO | 2009026505 A1 | 2/2009 |
| WO | 2013089624 A1 | 6/2013 |
| WO | 2013120652 A1 | 8/2013 |
| WO | WO2013120652 A1 | 8/2013 |

OTHER PUBLICATIONS

Extended European Search Report for EP14188311.6, dated Apr. 28, 2015.
T. Ishikawa, "Low Cost 320X240 uncooled IRFPA using conventional Silicon IC process." Opto-electronics Review, 1999, vol. 7. No. 4 pp. 297-303.
European Search Report for EP14196780, dated May 19, 2015.
European Search Report for EP14189783, dated Jun. 8, 2015.

* cited by examiner

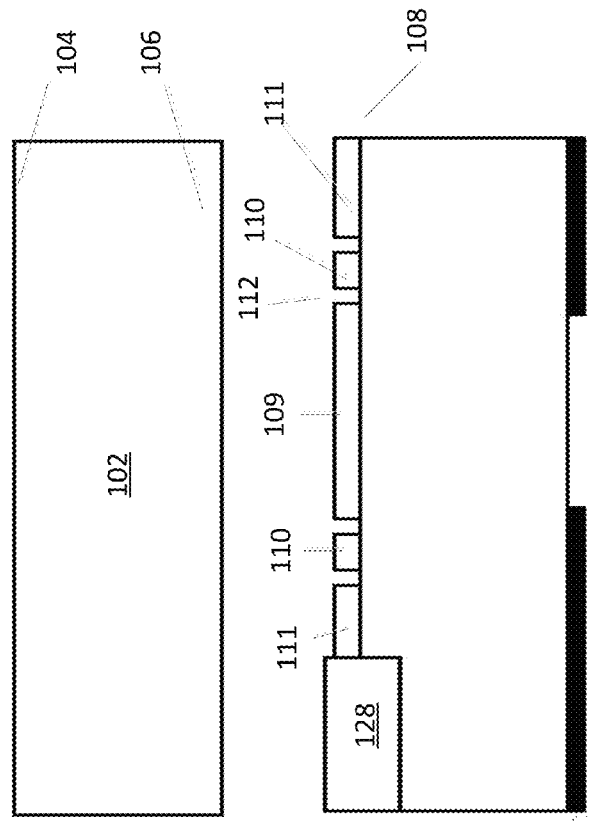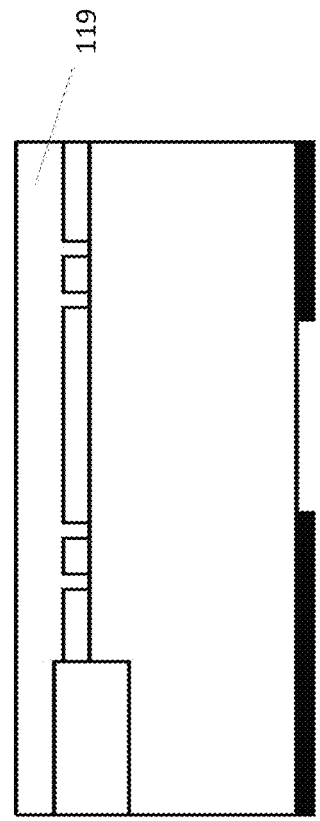

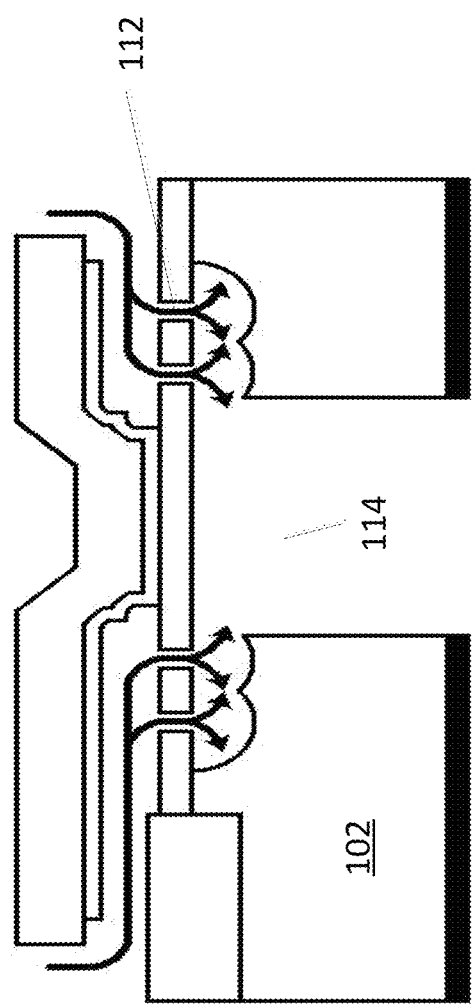

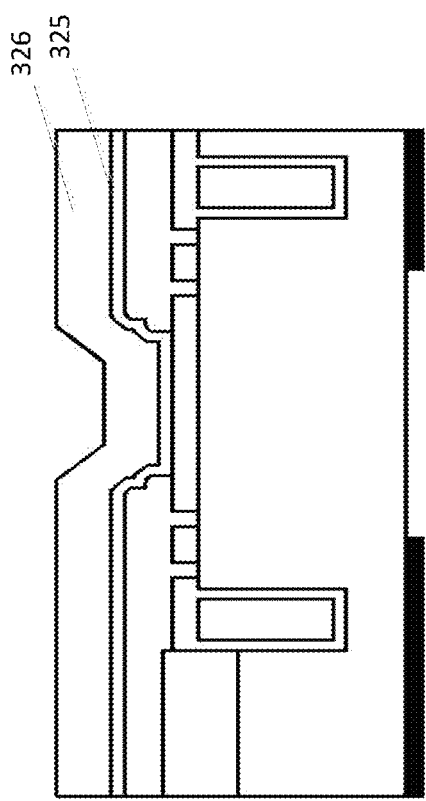
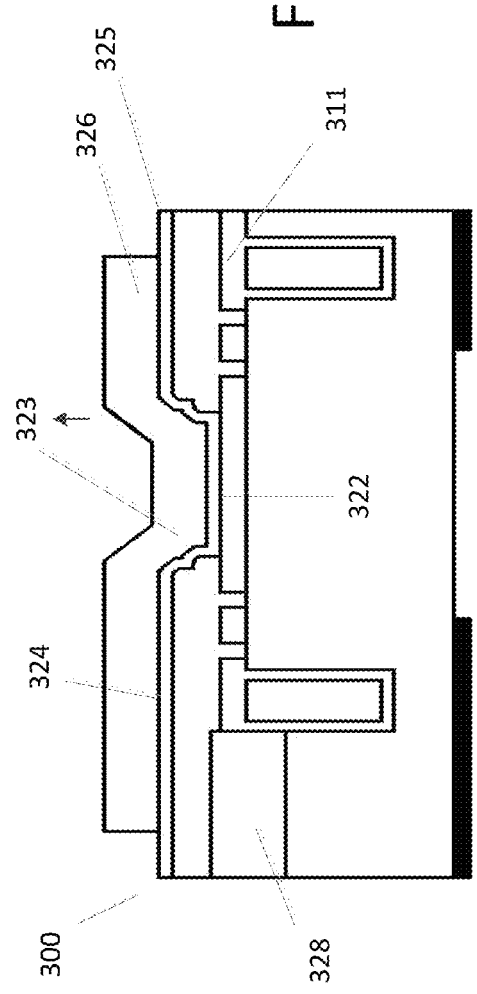

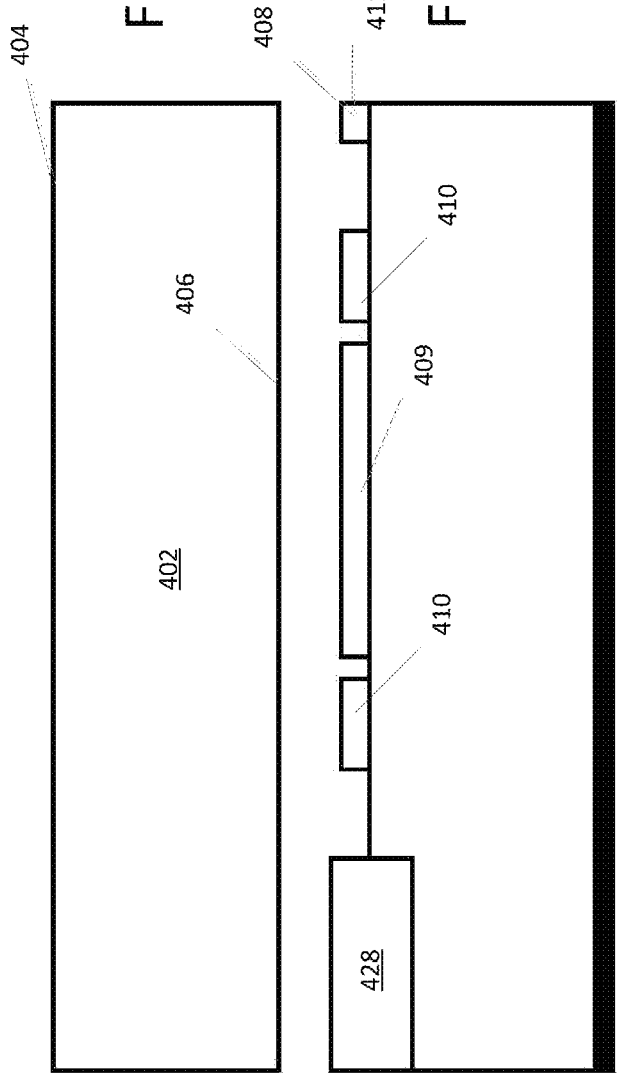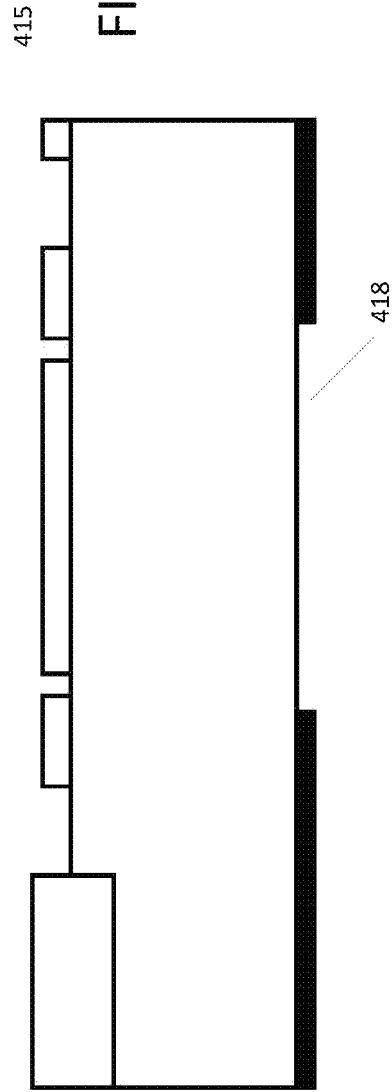

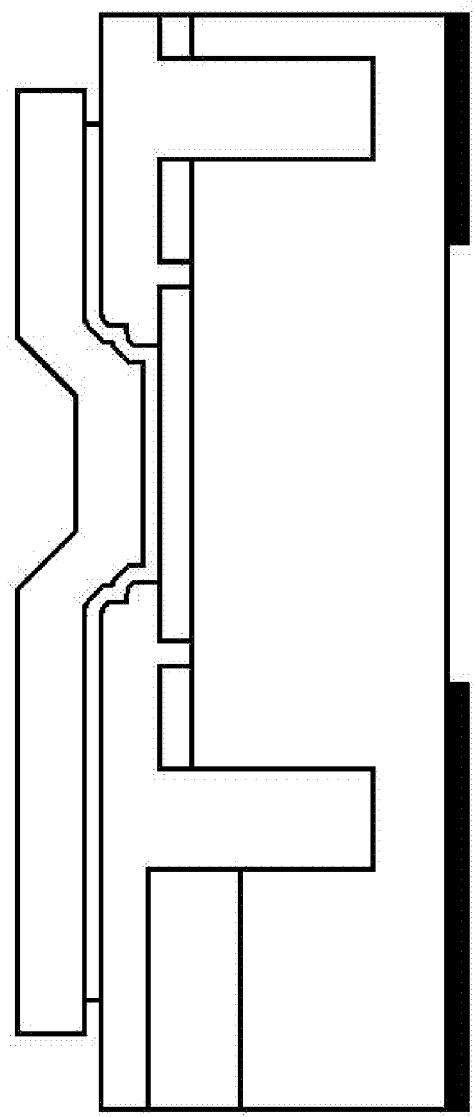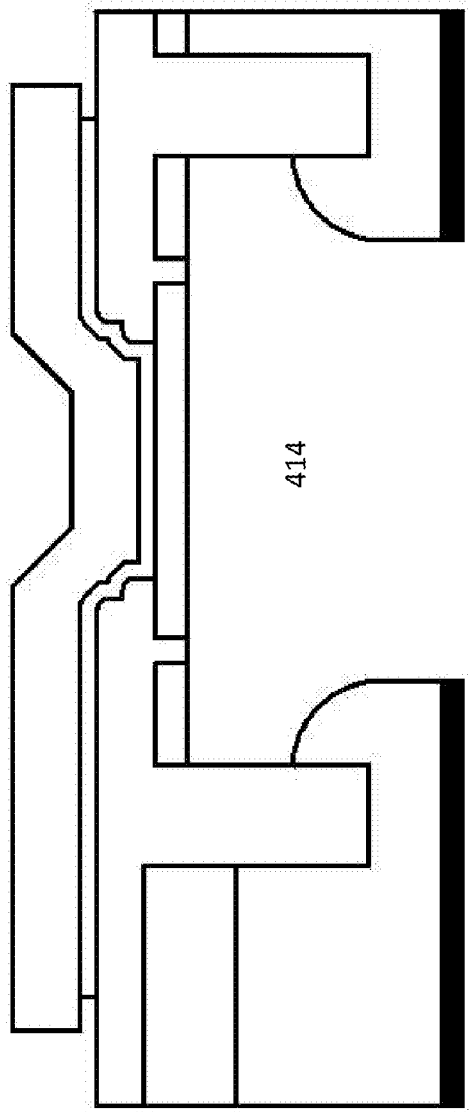

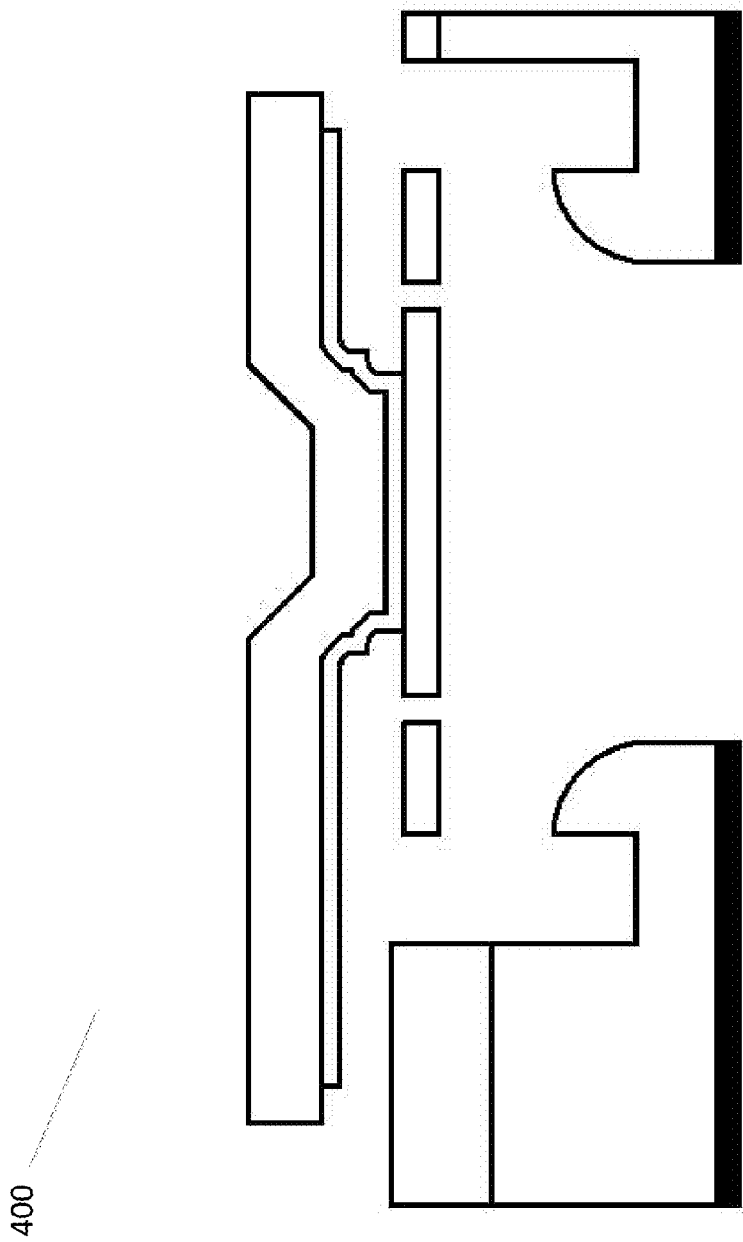

CMOS INTEGRATED METHOD FOR THE FABRICATION OF THERMOPILE PIXEL WITH UMBRELLA ABSORBER ON SEMICONDUCTOR SUBSTRATE

FIELD OF THE INVENTION

This disclosure relates to a pixel structure with an umbrella absorber and, more particularly, relates to processes for manufacturing a pixel structure with an umbrella absorber.

BACKGROUND

Infrared detectors sometime utilize pixel structures that include an absorber for absorbing infrared radiation and a transducer (e.g., a thermopile) to produce an electrical output signal proportional with infrared radiation absorbed by the absorber. In some implementations, these infrared detectors are designed to minimize heat loss from the absorber to an underlying substrate. Infrared detectors of this sort are useful in a variety of applications including, for example, infrared imagers.

SUMMARY OF THE INVENTION

In one aspect, a method of manufacturing a pixel structure having an umbrella absorber is disclosed. The method includes providing a substrate with a membrane on a first surface of the substrate. The membrane has one or more openings that expose one or more portions of the first surface, and includes a thermopile. A sacrificial layer is deposited on the membrane and in the one or more openings. The sacrificial layer is patterned to expose a portion of the membrane associated with one or more hot junctions of the thermopile. A rigid, thermally-conductive layer is formed on the sacrificial layer and on the exposed portion of the membrane associated with the one or more hot junctions of the thermopile. An absorber is deposited on the rigid, thermally-conductive layer. A cavity is formed in the substrate from a second surface of the substrate beneath the membrane and the sacrificial layer is removed.

In some implementations, one or more of the following advantages are present.

For example, in some implementations, a highly-efficient process may be realized for forming a thermopile structure (i.e., a pixel structure) having an umbrella absorber. In particular, these processes may efficiently integrate release of the umbrella absorber with release of the thermopile structure in one sequence.

Moreover, in some implementations, the techniques disclosed herein make possible the fabrication of an umbrella absorber in thick, highly absorbent material. The resulting thermopile structure can have very high responsivity due, at least in part, to an increased fill factor of the absorbent area.

In addition, the techniques described herein may, in certain implementations, facilitate making thermopile pixels (i.e., pixel structures) that are quite small—e.g., with dimensions under 75 micrometers. This results in reduced cost for manufacturing each pixel and thereby facilitates commercialization of low cost infrared imagers, for example.

The pixel structures disclosed herein can be used in a variety of applications.

In addition, in some implementations, the resulting umbrella absorber can be very thick (e.g., greater than 3 micrometers thick) with very high absorption coefficients (e.g., over 90%).

Other features and advantages will be apparent from the description and drawings, and from the claims.

BRIEF DESCRIPTION OF THE DRAWINGS

FIGS. 2A-2J show a sequence of steps in one implementation of a process of manufacturing the pixel structure of FIG. 1.

FIGS. 4A-M show a sequence of steps in an implementation of a process of manufacturing a second alternative pixel structure.

DETAILED DESCRIPTION

Figure 1:
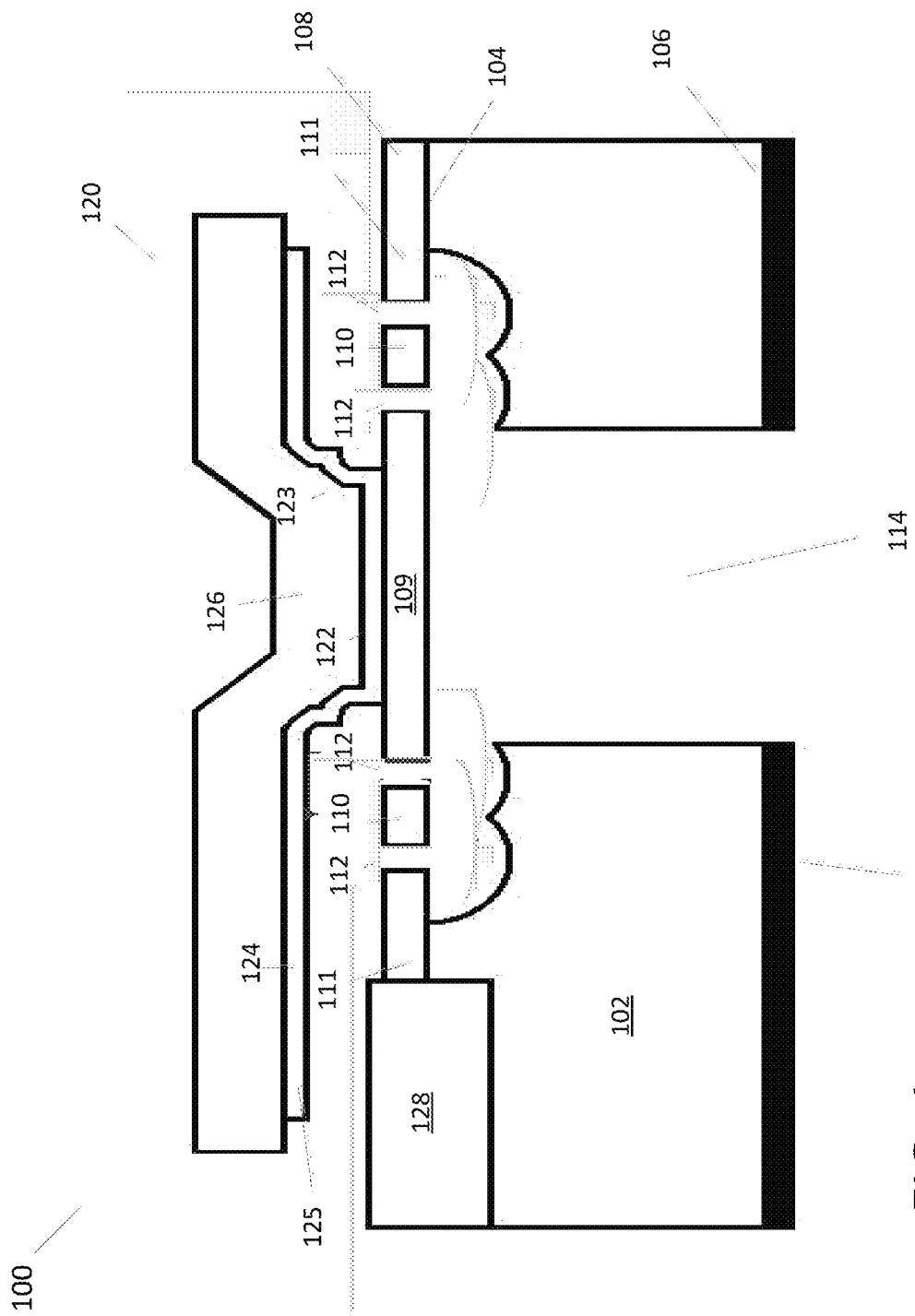
FIG. 1 is a side, cross-sectional view of a pixel structure with an umbrella-type absorber that may be used, for example, in an infrared sensor.

FIG. 1 shows a pixel structure 100 with an umbrella-type absorber that may be used, for example, in an infrared sensor.

The illustrated pixel structure 100 has a substrate 102 with a first ("upper") surface 104 and a second ("lower") surface 106. The upper surface 104 is opposite and substantially parallel to the lower surface 106. In a typical implementation, the substrate 102 is a semiconductor material, such as silicon.

A membrane 108 sits atop the upper surface 104 of the substrate 102. In a typical implementation, the membrane 108 is multi-layered structure that includes a thermopile. The multi-layered structure may include alternating layers of silicon oxide and silicon nitride, with at least portions of the thermopile sandwiched between two or more of the layers.

In a typical implementation, the thermopile is an electronic device that converts thermal energy into electrical energy. The thermopile can include two or more thermocouples connected in series or in parallel. Each thermocouple includes a pair of wires of dissimilar metals (e.g., copper and iron) joined together at one end to form a hot junction. If multiple thermocouples are connected in series then, typically, the hot junctions would be positioned so that they can sense whatever temperature is intended to be measured. Moreover, in a typical implementation, each wire in a thermocouple has an end opposite the hot junction that is substantially thermally insulated from the temperature that is intended to be measured. This end opposite the hot junction is typically referred to as a cold junction. So, in a typical implementation, for example, the hot junctions are positioned in close proximity to and in intimate thermal contact with a thermal absorber of a pixel structure and the cold junctions are positioned away from and substantially thermally insulated from the thermal absorber.

The illustrated membrane 108 defines a somewhat centrally-disposed portion (i.e., "a platform") 109 that includes the thermopile, a pair of legs 110, each of which extends from the platform and follows meandering pattern out to an outer portion 111 of the membrane. An electronic circuit 128 is coupled to the substrate 102 adjacent the membrane 108. In a typical implementation, the platform 109, the legs 110 and the outer portion 111 include electrically conductive elements configured to electrically couple the thermopile (in the platform 109) to the electronic circuit 128.

In general, the electronic circuit is configured to receive and process data from the thermopile and/or output data to one or more other electronic circuits or devices (not shown). In a typical implementation, the electronic circuit 128 is an integrated circuit and may be implemented using complementary metal-oxide-semiconductor ("CMOS") technology, or the like.

In a typical implementation, the meandering patterns formed by the legs 110 of the membrane 108 help to thermally insulate the platform 109, including the thermopile inside the platform, from the other portions of the pixel structure 100 such as the outer portion 111 of the membrane 108 and the electronic circuit 128.

There are openings 112 shown in the cross-sectional view of the membrane 108 in FIG. 1 between the platform 109, the meandering legs 110, and the other portion 111 of the membrane 108.

A cavity 114 extends from the second ("lower") surface of the substrate 104 to the membrane 108. The cavity 114 is substantially aligned with the platform 109, which includes the thermopile, of the membrane 108. In addition, the portion of the cavity 114 near the membrane 108 extends outward under the legs-portion 110 of the membrane 108 and beyond.

An etch mask 116 (which is used to form the cavity, but may be removed) is coupled to the second ("lower") surface 106 of the substrate 102. In the illustrated example, the etch mask 116 has an opening 118 that is aligned with the cavity 114 in the substrate 102. As discussed in further detail herein, during manufacturing, the etch mask 116 may be used to etch away portions of the substrate 102 to form the cavity 114.

An umbrella structure 120 sits atop the platform 109 of the membrane 108. The umbrella structure 120 has two-layers: a rigid, thermally-conductive layer 125 and an absorber 126.

The rigid, thermally-conductive layer 125 can be any type of rigid, thermally-conductive material, such as a metal or metal alloy. In the illustrated implementation, the rigid, thermally-conductive layer 125 is contoured to define a substantially flat base portion 122, an elevated portion 124 and a transition portion 123 between the base portion 122 and the elevated portion 124.

The base portion 122 of the rigid, thermally-conductive layer 125 is in direct physical contact with an upper surface of the platform 109 section of the membrane 108.

The transition portion 123 of the rigid, thermally-conductive layer 125 extends upward and outward, with a sloped configuration, from the base portion 122 to the elevated portion 124. The transition portion 123 in the illustrated example has a stepped configuration (in cross-section), which is optional. In some implementations, the stepped-shape of the rigid, thermally-conductive layer 125 at the transition portion 123 results in enhanced mechanical stability and thermal conductivity of the rigid, thermally-conductive layer 125 and the absorber layer 126. In some implementations, there may be simply a gradual slope (without a step) at the transition portion 123 between the base portion 122 and the elevated portion 124 and this may result in comparable, but not identical, performance characteristics.

The elevated portion 124 of the rigid, thermally-conductive layer 125 extends in an outward direction from the top of the transition portion 123 substantially parallel to the upper surface of the membrane 108. In the illustrated implementation, the transition portion 123 and the elevated portion 125 extend outward to cover: 1) portions of the platform 109 not in contact with the rigid, thermally-conductive layer 125, 2) the legs 110, 3) parts of the outer portion 111 of the membrane 108, and part of the electronic circuit 128.

The size and shape of the transition portion 123 and the elevated portion 124 of the rigid, thermally-conductive layer 125 can be different than what is shown in the figure. In various implementations, the transition portion 123 and the elevated portion 124 may cover more or less of the pixel structure 100 than shown.

In a typical implementation implementations, the base portion 122 of the rigid, thermally-conductive layer 125 is circular, oval, square or rectangular (or any other shape), the transition portion 123 extends peripherally upward and outward from the entire periphery of the base portion 122 and the elevated portion 124 extends outward from the entire periphery of the transition portion 123.

The absorber 126 sits atop the rigid, thermally-conductive layer 125. The absorber can be any type of material that can absorb energy. Exemplary absorber materials include organic and inorganic compound mixture, such as a polymer filed with graphite and a matting agent (e.g., Silica). In a typical implementation, due to the rigidity of layer 125, the absorber 126 can be quite thick. Indeed, in some implementations, the absorber 126 can be thicker than 3 micrometers.

In the illustrated implementation, the absorber 126 substantially follows the contours of the rigid, thermally-conductive layer 125. Moreover, in the illustrated implementation, the absorber 126 extends outward a bit beyond the outer edges of the elevated portion 124 of the rigid, thermally-conductive layer 125.

Although the base portion 122 of the rigid, thermally-conductive layer 125 in the illustrated implementation is shown to be in direct physical contact with the platform portion 109 of the membrane 108, direct physical contact in this regard is not required. Indeed, in a typical implementation, as long as the base portion 122 is substantially thermally-coupled to the platform portion 109 of the membrane 108 that should suffice.

Moreover, in a typical implementation, the base portion 122 of the rigid, thermally-conductive layer 125 is thermally-coupled (or in direct physical contact with) a portion of the platform 109 of the membrane that includes the hot junctions of the thermopile. With this kind of arrangement, heat from the umbrella structure 120 is able to easily and efficiently travel into membrane 108 and have an effect on the hot junctions of the thermopile. In a typical implementation, the membrane 108 is configured to electrically insulate the thermopile from any adjacent elements (e.g., the rigid, thermally-conductive layer 125) in the pixel structure 100.

FIGS. 2A-2J shows the steps in one implementation of a process of manufacturing the pixel structure 100 in FIG. 1.

First, the illustrated process includes providing the substrate 102. (See FIG. 2A). The substrate 102 has a first (upper) surface 104 and a second (lower) surface 106. The upper surface 104 of the substrate 102 is opposite and substantially parallel to the lower surface 106 of the substrate 102.

Next (see FIG. 2B), the illustrated process includes providing the patterned membrane 108, which includes the thermopile (not shown), and the electronic circuit 128 on the upper surface 104 of the substrate 102. In the illustrated example, the electronic circuit 128 is adjacent and in physical contact with the patterned membrane 108. Moreover, the electronic circuit 128 sits recessed a small amount into the upper surface 104.

The membrane 108 is patterned to define the somewhat centrally-disposed portion (i.e., "a platform") 109, the pair of legs 110, each of which extends from the platform 109 and follows meandering pattern out to the outer portion 111 of the membrane 108.

The electronic circuit 128 is built in the substrate 102 adjacent the membrane 108.

The openings 112 in the membrane 108 between the platform 109, the legs 110 and the outer portion 111 expose portions of the upper surface 104 of the substrate 102.

The platform 109 includes a thermopile (not shown). Moreover, in a typical implementation, the platform 109, the legs 110 and the outer portion 111 include electrically conductive elements that electrically couple the thermopile to the electronic circuit 128.

As also shown in FIG. 2B, the illustrated process includes coupling the etch mask 116 to the lower surface 106 of the substrate 102. In a typical implementation, the etch mask 116 is configured to act as a mask for deep reactive ion-etching. The etch mask can be any one of a variety of different materials. For example, in some implementations, the etch mask 116 is a metal layer.

The etch mask 116 has an opening 118 that is substantially aligned with the platform 109 portion of the membrane 108. Since the platform 109 portion of the membrane 108 contains the thermopile, as discussed below in further detail, etching through the opening 118 in the etch mask 116 can effectively remove the substrate material from beneath the platform 109 portion of the membrane 108.

According to FIG. 2C, the process includes depositing a sacrificial layer 119 on the membrane 108 and in the openings 112 in the membrane 108. It is generally desirable that the upper surface of the sacrificial layer 119 be substantially planar. This is because, as discussed below, additional layers are subsequently deposited onto the upper surface of the sacrificial layer 119 and it is desirable that those additional layers be substantially planar. In this regard, up to a certain limit, making the sacrificial layer 119 thicker as is it deposited onto the underlying structures makes the upper surface of the sacrificial layer 119 more planar.

Moreover, it is generally desirable that the sacrificial layer 119 be 5-15 μm thick so that the structures subsequently formed above parts of the sacrificial layer (i.e., the rigid, thermally conductive layer 125 and the absorber 126, see FIG. 1) are high enough above the membrane 108 and electronic circuit 128 to ensure that the edges of the absorber 126 that will hang over the outer edges of the rigid, thermally conductive layer 125 will not hang down so far as to physically contact any of the underlying structures.

Figure 2D:
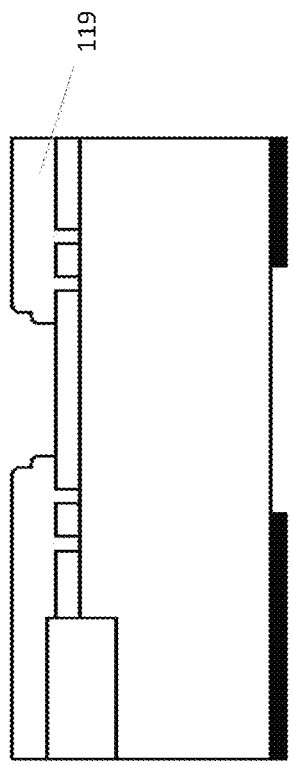

Next, and referring now to FIG. 2D, the process includes patterning the sacrificial layer to expose a portion of the membrane 108 associated with one or more hot junctions of the thermopile. In the illustrated example, the patterning exposes at least part of the platform 109 portion of the membrane 108. More particularly, in the illustrated example, the patterning exposes the central part of the platform, which, in the illustrated example, contains one or more (or all) of the hot junctions of the thermopile.

In a typical implementation, the sacrificial layer 119 may be patterned using a double mask process to create an opening with a side wall that has a stepped configuration (in cross-section). In some implementations, instead of the stepped configuration, the side wall of the opening may have a substantially constant slope from the membrane to the upper surface of the sacrificial layer 119.

Figure 2E:
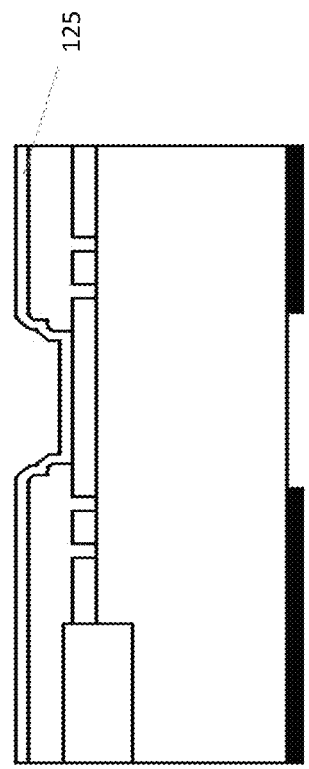

Next, according to the illustrated example, and as shown in FIG. 2E, the process includes forming the rigid, thermally-conductive layer 125 on the upper surface of the sacrificial layer and on the exposed portion of the membrane 108, which is associated with (e.g., contains) the one or more hot junctions of the thermopile.

The rigid, thermally-conductive layer 125 can be formed by any low temperature deposition process which does have adverse effects (either physical or chemical on the structures already present on first (upper) side of the wafer. In a typical implementation, for example, the rigid, thermally-conductive layer 125 is formed by sputtering a metallic material onto the upper surface of the sacrificial layer and onto the exposed portion of the membrane 108.

Figure 2F:
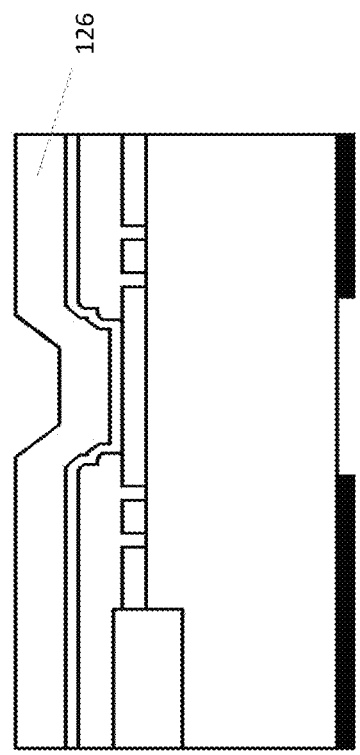

According to FIG. 2F, the process includes depositing the absorber 126 (e.g., by spinning or other processes) onto the upper surface of the rigid, thermally-conductive layer 125. As shown in the illustrated implementation, the absorber 126 substantially follows the contours of the underlying rigid, thermally-conductive layer 125. Typically, the absorber 126 is deposited so as to have a thickness of greater than 3 micrometers.

Figure 2G:
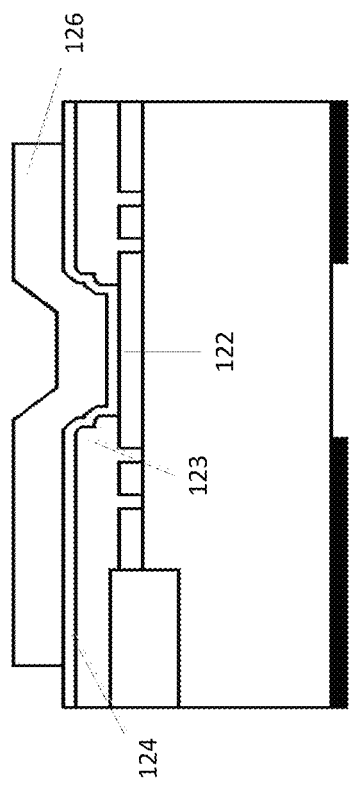

Referring now to FIG. 2G, the process includes patterning the absorber 126. In some implementations, this patterning step is implemented using photolithography, or the like. More particularly, the patterning removes some of the absorber material to leave intact a single contiguous absorber structure for the pixel structure 100.

The single contiguous absorber structure in the illustrated example is in contact with the entire upper surface of the substantially flat base portion 122 of the rigid, thermally-conductive layer 125, the entire upper surface of the transition portion 123 of the rigid, thermally-conductive layer 125 and part of the elevated portion 124. The portions of the single contiguous absorber structure that are in contact with part of the elevated portion 124 after the patterning step in FIG. 2G extend outward so that its outer edges cover portions of the outer portion 111 of the membrane 108 and the electronic circuit 128.

Figure 2H:
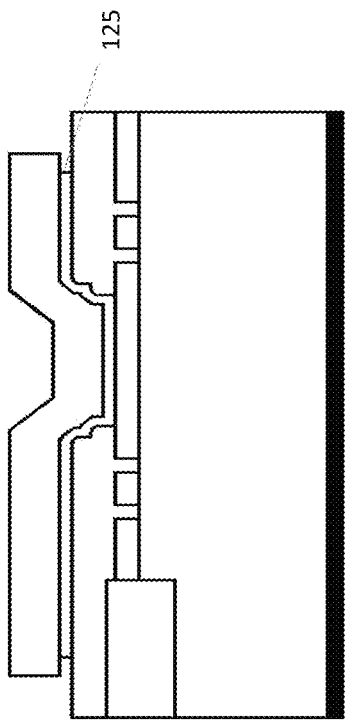

According to FIG. 2H, the illustrated process includes patterning the rigid, thermally-conductive layer 125. In a typical implementation, the rigid, thermally-conductive layer 125 may be patterned using the patterned absorber as a mask. In the illustrated example, the patterning of the rigid, thermally-conductive layer 125 results in the rigid, thermally-conductive layer 125 having a perimeter that substantially follows, but is slightly undercut relative to, the outer edges of the absorber 126.

Figure 2I:
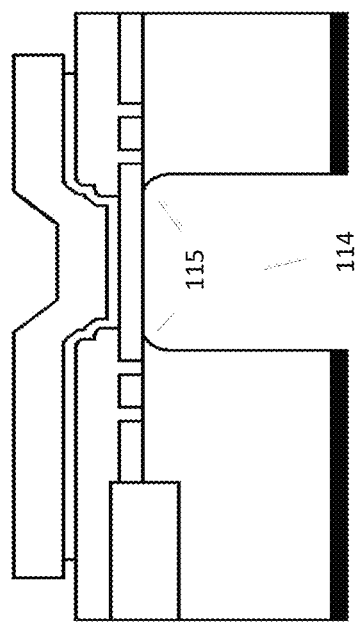

Next, at FIG. 2I, the illustrated process includes forming the cavity 114 in the substrate from the lower surface of the substrate 104 to the membrane 108. The cavity 114 is substantially aligned with the platform 109, which includes the thermopile, of the membrane 108. In addition, the portion of the cavity 114 near the membrane 108 extends outward under the legs-portion 110 of the membrane 108 and beyond.

The cavity 114 may be formed using any one of a variety of techniques. In one example, the cavity 114 is formed using a deep reactive ion etching ("DRIE") technique through the opening in the etch mask 116. In general, DRIE is a highly anisotropic etch process that may be used, for example, to create deep penetration, steep-sided holes and trenches in wafers/substrates, typically with high aspect ratios. The rounded edges 115 at the bottom of the cavity 114 may be formed utilizing a "soft landing" technique in the DRIE.

As shown in FIG. 2J, the process includes releasing the elevated portion of the umbrella structure 120 from other portions of the pixel structure 100. In the illustrated implementation, this includes removing (e.g., by isotropically etching away) the sacrificial layer and parts of the substrate 102. In general, isotropic etching is non-directional removal of material from a substrate via a chemical process using an etchant. The etchant may be, for example, a corrosive liquid or a chemically active ionized gas, known as plasma.

In the illustrated example, the isotropic etchant is applied to the top side of the pixel structure 100; it first attacks the sacrificial layer 119 material and then works its way down through the openings 112 in the membrane 108 to attack portions of the substrate 102 underlying the openings 112. Eventually, the substrate 102 material is etched away all the way to the cavity 114.

In a typical implementation, the combination of DRIE from the bottom of the pixel structure 110 and isotropic etching from the top of the pixel structure produces a cavity 114 in the substrate contoured substantially as shown in FIG. 2J.

Figure 3A:
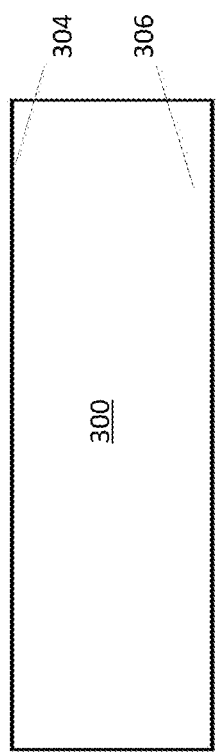
FIGS. 3A-3N show a sequence of steps in an implementation of a process of manufacturing an alternative pixel structure.
Figure 3B:
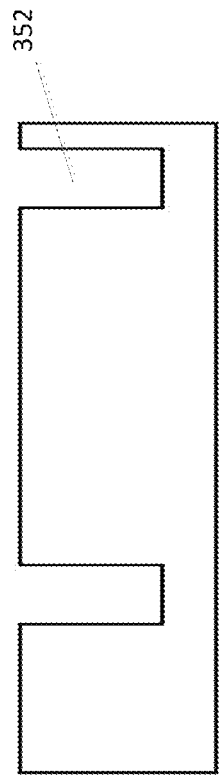
Figure 3C:
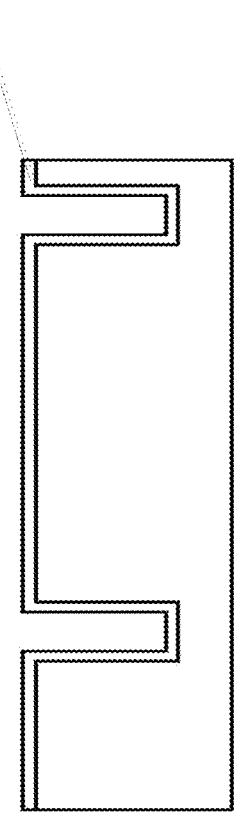
Figure 3D:
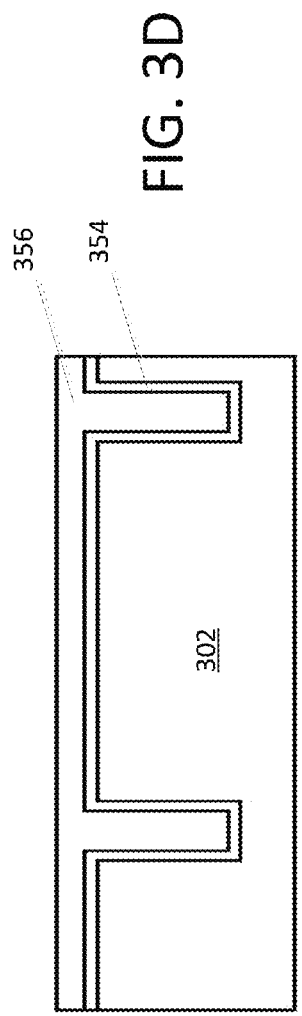
Figure 3E:
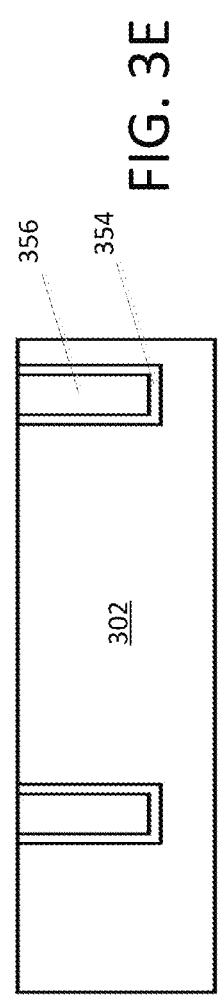
Figure 3F:
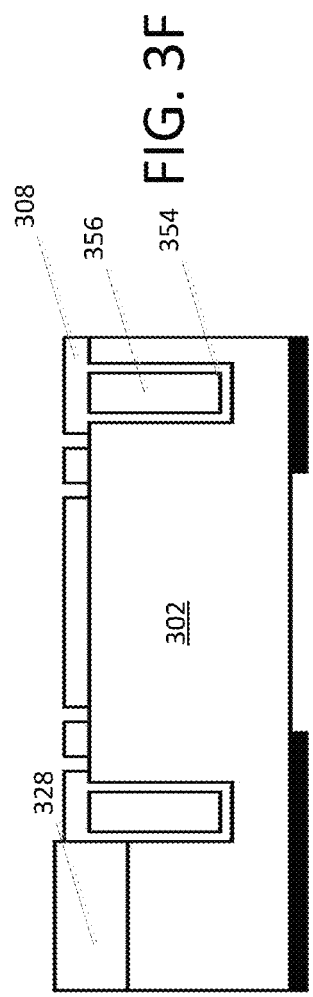
Figure 3G:
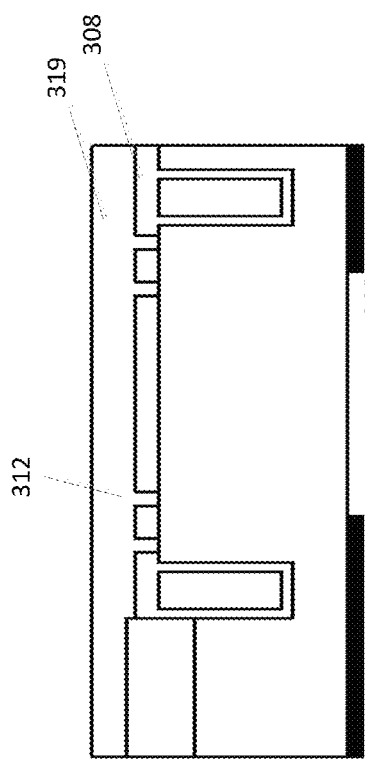
Figure 3H:
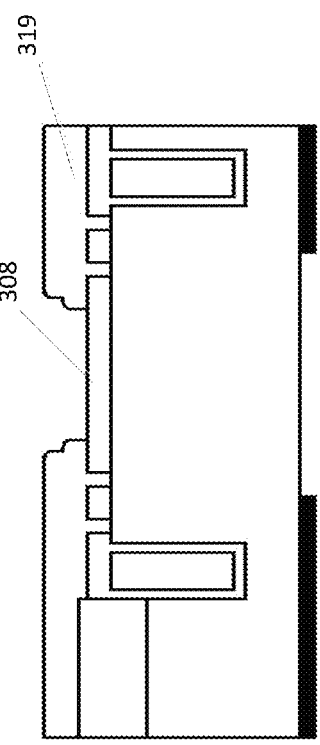
Figure 3I:
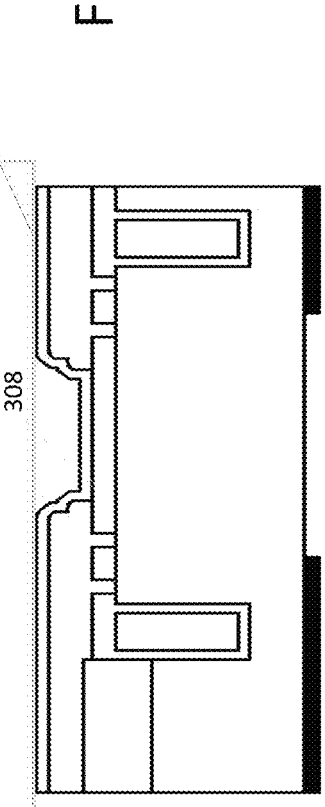
Figure 3L:
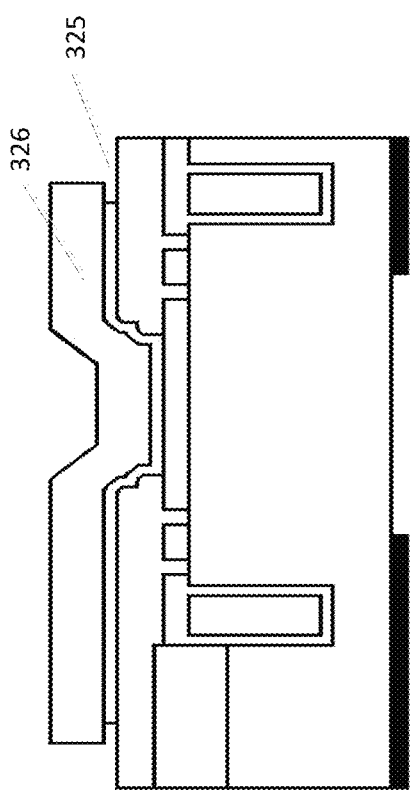
Figure 3M:
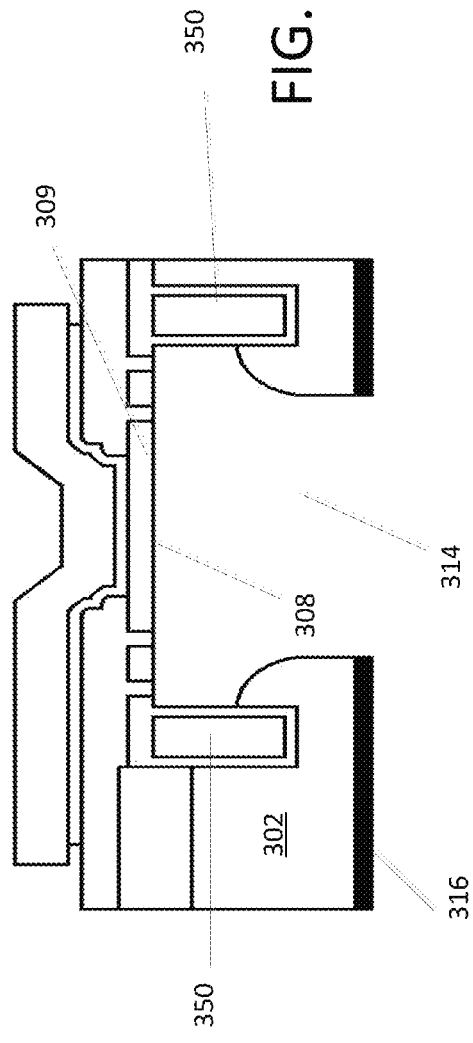
Figure 3N:
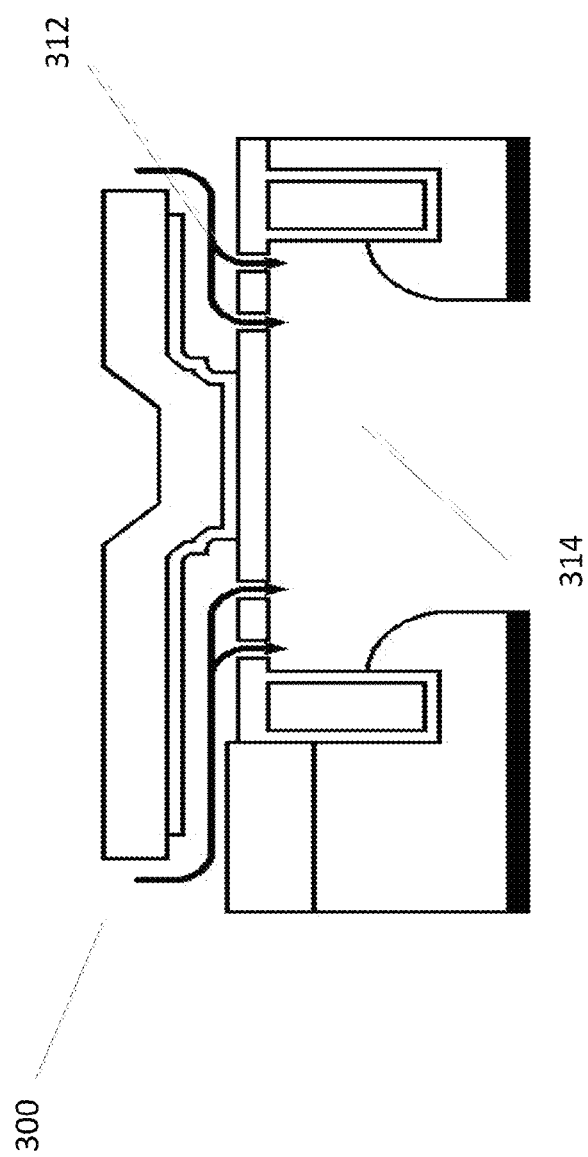

FIGS. 3A-3N shows the steps in an implementation of a process of manufacturing a pixel structure 300 that is similar to the pixel structure in FIG. 1. One main difference between the pixel structure 300 and the pixel structure 100 is the isolating trench 350 in the pixel structure 300.

First, the illustrated process includes providing the substrate 302. (See FIG. 3A). The substrate 302 has a first (upper) surface 304 and a second (lower) surface 306. The upper surface 304 of the substrate 302 is opposite and substantially parallel to the lower surface 306 of the substrate 302.

Next (see FIG. 3B), the process includes forming a trench 350 in the substrate 102. The trench can be formed using any one of a variety of techniques. Moreover, the trench can be virtually any shape (e.g., circular, oval, square, rectangular, etc.). In a typical implementation, the trench surrounds an area of the substrate that will be etched away subsequently to produce the cavity 314 in the pixel structure (see FIG. 3N). However, it is not necessary that a trench completely surround this kind of area. Moreover, although the cross sectional shape of the trench 350 is depicted as being substantially rectangular with a flat base and vertical sides, the trench profile can have other shapes such a substantially V-shaped or substantially U-shaped profile.

Referring now to FIG. 3C, the illustrated process includes applying a passivation layer 354 to the substrate 102, along the upper surface 304 and in the trench 350. In a typical implementation, the passivation layer 354 is adapted to resist being etched, particularly when exposed to etching conditions associated with forming the cavity 314 (see FIGS. 3M and 3N). The passivation material is a dielectric able to resist etching of silicon such as silicon dioxide or silicon nitride. The material can be either grown (e.g. thermal oxidation) or deposited from vapor phase.

Turning now to FIG. 3D, the illustrated process includes depositing a polysilicon layer 356 from vapor phase atop the passivation layer 354. In a typical implementation, the passivation layer 354 electrically isolate the polysilicon (in layer 356) from the substrate 302. Other materials such as silicon dioxide or silicon nitride, also deposited from vapor phase can also be used for the trench filling.

Next, as shown in FIG. 3E, the illustrated process includes removing part of the polysilicon layer 356, part of the passivation layer 354 and, optionally, part of the substrate 302 to create a substantially planar upper surface. According to the illustrated implementation, the planarization step removes all of the passivation layer material that is not in the trench and all of the polysilicon layer material that is not in the trench. After planning, the trenches remain lined with the passivation layer material that extends up to the substantially flat upper surface, and the trenches remain filled with the polysilicon layer material up to the substantially flat upper surface.

Next (see FIG. 3F), the illustrated process includes providing a patterned membrane 308, which includes a thermopile (not shown), and an electronic circuit 328 on the upper surface 304 of the substrate 102. In the illustrated example, the electronic circuit 328 is adjacent to and in physical contact with the patterned membrane 308. Moreover, the electronic circuit 328 sits recessed a small amount into the upper surface 304.

The membrane 308 is patterned to define the somewhat centrally-disposed portion (i.e., "a platform") 309, the pair of legs 310, each of which extends from the platform 309 and follows meandering pattern out to the outer portion 311 of the membrane 308.

The electronic circuit 328 is coupled to the substrate 302 adjacent the membrane 308.

The openings 312 in the membrane 308 between the platform 309, the legs 310 and the outer portion 311 expose portions of the upper surface 304 of the substrate 302.

The platform 309 includes a thermopile (not shown). Moreover, in a typical implementation, the platform 309, the legs 310 and the outer portion 311 include electrically conductive elements that electrically couple the thermopile to the electronic circuit 328.

As shown, the membrane 308 is positioned such that the outer portions 311 of the membrane 308 sit atop and cover the trenches.

As also shown in FIG. 3F, the illustrated process includes coupling the etch mask 316 to the lower surface 306 of the substrate 302. In a typical implementation, the etch mask 316 is configured to act as a mask for deep reactive ion-etching. The etch mask can be any one of a variety of different materials. For example, in some implementations, the etch mask 316 is a metal layer.

The etch mask 316 has an opening 318 that is substantially aligned with the platform 309 portion of the membrane 308. Since the platform 309 portion of the membrane 308 contains the thermopile, as discussed below in further detail, etching through the opening 318 in the etch mask 316 can effectively remove the substrate material from beneath the platform 309 portion of the membrane 308.

According to FIG. 3G, the process includes depositing a sacrificial layer 319 on the membrane 308 and in the openings 312 in the membrane 308. It is generally desirable that the upper surface of the sacrificial layer 319 be substantially planar. This is because, as discussed below, additional layers are subsequently deposited onto the upper surface of the sacrificial layer 319 and it is desirable that those additional layers be substantially planar. In this regard, up to a certain limit, making the sacrificial layer 319 thicker as is it deposited onto the underlying structures makes the upper surface of the sacrificial layer 319 more planar.

Moreover, it is generally desirable that the sacrificial layer 319 be thick so that the structures subsequently formed above parts of the sacrificial layer (i.e., the rigid, thermally conductive layer 325 and the absorber 326, see FIG. 3N) are high enough above the membrane 308 and electronic circuit 328 to ensure that the edges of the absorber 326 that will hang over the outer edges of the rigid, thermally conductive layer 325 will not hang down so far as to physically contact any of the underlying structures.

Next, and referring now to FIG. 3H, the process includes patterning the sacrificial layer to expose a portion of the membrane 308 associated with one or more hot junctions of the thermopile. In the illustrated example, the patterning exposes at least part of the platform 309 portion of the membrane 308. More particularly, in the illustrated example, the patterning exposes the central part of the platform, which, in the illustrated example, contains one or more (or all) of the hot junctions of the thermopile.

In a typical implementation, the sacrificial layer 319 may be patterned using a double mask process to create an opening with a side wall that has a stepped configuration (in cross-section). In some implementations, instead of the stepped configuration, the side wall of the opening may have a substantially constant slope from the membrane to the upper surface of the sacrificial layer 319.

Next, according to the illustrated example, and as shown in FIG. 3I, the process includes forming a rigid, thermally-conductive layer 325 on the upper surface of the sacrificial layer and on the exposed portion of the membrane 308, which is associated with (e.g., contains) the one or more hot junctions of the thermopile.

The rigid, thermally-conductive layer 325 can be formed by any low temperature deposition process which does have adverse effects (either physical or chemical on the structures already present on first (upper) side of the wafer. In a typical implementation, for example, the rigid, thermally-conductive layer 325 is formed by sputtering a metallic material onto the upper surface of the sacrificial layer and onto the exposed portion of the membrane 308.

According to FIG. 3J, the process includes depositing the absorber 326 (e.g., by spinning or other processes) onto the upper surface of the rigid, thermally-conductive layer 325. As shown in the illustrated implementation, the absorber 326 substantially follows the contours of the underlying rigid, thermally-conductive layer 325. Typically, the absorber 326 is deposited so as to have a thickness of greater than 3 micrometers.

Referring now to FIG. 3K, the process includes patterning the absorber 326. In some implementations, this patterning step is implemented using photolithography, or the like. More particularly, the patterning removes some of the absorber material to leave intact a single contiguous absorber structure for the pixel structure 300.

The single contiguous absorber structure in the illustrated example is in contact with the entire upper surface of the substantially flat base portion 322 of the rigid, thermally-conductive layer 325, the entire upper surface of the transition portion 323 of the rigid, thermally-conductive layer 325 and part of the elevated portion 324. The portions of the single contiguous absorber structure that are in contact with part of the elevated portion 324 after the patterning step in FIG. 3K extend outward so that its outer edges cover portions of the outer portion 311 of the membrane 308 and the electronic circuit 328.

According to FIG. 3L, the illustrated process includes patterning the rigid, thermally-conductive layer 325. In a typical implementation, the rigid, thermally-conductive layer 325 may be patterned using the patterned absorber as a mask. In the illustrated example, the patterning of the rigid, thermally-conductive layer 325 results in the rigid, thermally-conductive layer 325 having a perimeter that substantially follows, but is slightly undercut relative to, the outer edges of the absorber 326.

Next, at FIG. 3M, the illustrated process includes forming the cavity 314 in the substrate from the lower surface of the substrate 302 to the membrane 308 and out to the trench 350 at the bottom (i.e., close to the membrane 308) of the cavity 316. The cavity 314 is substantially aligned with the platform 309, which includes the thermopile, of the membrane 308. In addition, the portion of the cavity 314 near the membrane 108 extends outward to the trench 350 under the legs-portion 310 of the membrane 308 and beyond.

The cavity 314 may be formed using any one of a variety of techniques. In one example, the cavity 314 is formed using a deep reactive ion etching ("DRIE") technique through the opening in the etch mask 316. In general, DRIE is a highly anisotropic etch process that may be used, for example, to create deep penetration, steep-sided holes and trenches in wafers/substrates, typically with high aspect ratios. The cavity extensions (out to the trenches 350) may be produced with notching.

Next, as shown in FIG. 3N, the process includes releasing the elevated portion of the umbrella structure 320 from other portions of the pixel structure 300. In the illustrated implementation, this includes removing (e.g., by isotropically etching away) the sacrificial layer and parts of the substrate 302. In general, isotropic etching is non-directional removal of material from a substrate via a chemical process using an etchant. The etchant may be, for example, a corrosive liquid or a chemically active ionized gas, known as plasma.

In the illustrated example, the isotropic etchant is applied to the top side of the pixel structure 300; it first attacks the sacrificial layer 319 material and then works its way down through the openings 312 in the membrane 308 to attack portions of the substrate 302 underlying the openings 312. Eventually, the substrate 302 material is etched away all the way to the cavity 314.

In a typical implementation, the combination of DRIE from the bottom of the pixel structure 310 and isotropic etching from the top of the pixel structure produces a cavity 314 in the substrate contoured substantially as shown in FIG. 3N.

FIGS. 4A-4M shows the steps in an implementation of a process of manufacturing a pixel structure 400.

One main difference between the process represented in FIGS. 4A-4M and the other implementation disclosed in connection with FIGS. 3A-3N, for example, is that the isolating trench 450 in FIGS. 4A-4M is formed in the substrate 402 after the electronic circuit 428 (e.g., a CMOS structure) and the patterned membrane 408, which includes a thermopile (not shown), are provided on the substrate 402.

Referring to FIG. 4A, the illustrated process includes providing the substrate 402. The substrate 402 has a first (upper) surface 404 and a second (lower) surface 406. The upper surface 404 of the substrate 402 is opposite and substantially parallel to the lower surface 406 of the substrate 402.

Next (see FIG. 4B), the process includes providing the electronic circuit 428 and the patterned membrane 408 on the upper surface 404 of the substrate 402.

In the illustrated example, the electronic circuit 428 is adjacent to and in physical contact with the patterned membrane 408. The patterned membrane 408 is on the upper surface 404, but the electronic circuit 428 is recessed a small amount into the upper surface 404.

The membrane 408 is patterned to define the somewhat centrally-disposed portion (i.e., "a platform") 409, the pair of legs 410, each of which extends from the platform 409 and follows meandering pattern out to the outer portion 411 of the membrane 408. In cross-section, as shown, there are openings 412 in the membrane 408 between the platform 409, the legs 410 and the outer portion 411. These openings 412 expose portions of the upper surface 404 of the substrate 402.

In a typical implementation, the platform 409, the legs 410 and the outer portion 411 include electrically conductive elements that electrically couple the thermopile to the electronic circuit 428.

In addition, the illustrated process includes coupling a mask material 415 to the lower surface 406 of the substrate 402. In a typical implementation, the etch mask material 415 is configured to act as a mask for deep reactive ion-etching. The etch mask material 415 can be any one of a variety of different materials. For example, in some implementations, the etch mask material 415 is a metal layer.

In FIG. 4C, the process includes patterning the etch mask material 415 to form an etch mask 416 with an opening 418 that is substantially aligned with the platform 409 portion of the membrane 408. Since the platform 409 portion of the membrane 408 contains the thermopile, as discussed below in further detail, etching through the opening 418 in the etch mask 416 can effectively remove the substrate material from beneath the platform 409 portion of the membrane 408.

Figure 4D:
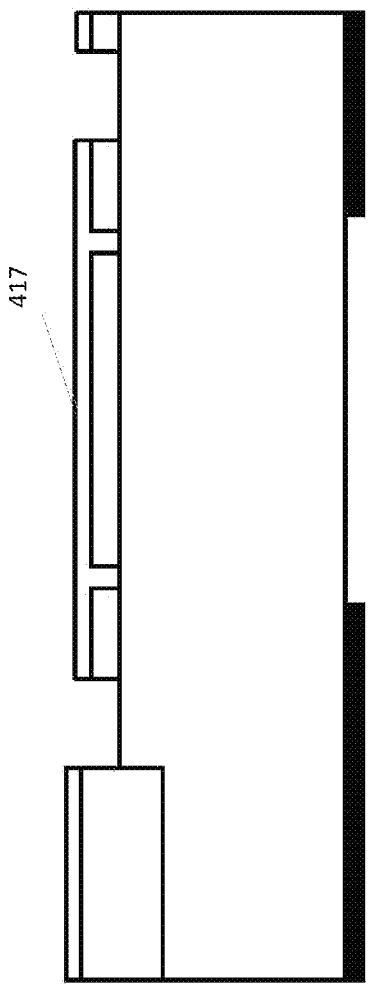
Figure 4E:
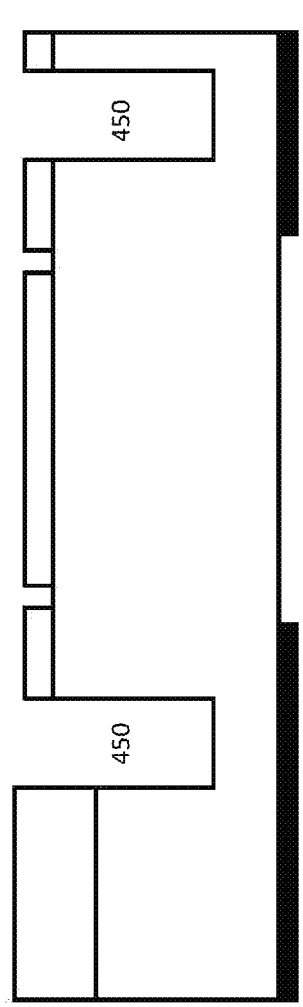

Next, as shown in FIG. 4D, the process includes applying an anisotropic etch mask 417 to all of the upper surfaces of the illustrated wafer except where the isolating trenches will be formed. More particularly, in the illustrated example, the anisotropic etch mask 417 is applied to cover the electronic circuit 428, the patterned membrane 408 and the openings 412 between the platform 409 portion of the patterned membrane 408 and the legs 410 portion of the patterned membrane 408.

The next step in the illustrated implementation includes forming a trench in the substrate. See FIG. 4E.

The trench can be formed using any one of a variety of techniques. Moreover, the trench can be virtually any shape (e.g., linear, circular, oval, square, rectangular, etc.). In a typical implementation, the trench surrounds an area of the substrate that will be etched away subsequently to produce a cavity 414 in the lower surface of the pixel structure (see FIG. 4L). However, it is not necessary that a trench completely surround this kind of area. Moreover, although the cross sectional shape of the trench 450 is depicted as being substantially rectangular with a flat base and vertical sides, the trench profile can have other shapes such a substantially V-shaped or substantially U-shaped profile. Moreover, the trench has a depth that extends at least partially through the substrate 402, but typically not through the entire substrate 402.

In a typical implementation, the trench is formed by anisotropic etching through the openings in the anisotropic etch mask 417. In a typical implementation, the anisotropic etching is a deep reactive-ion etching (DRIE).

Figure 4F:
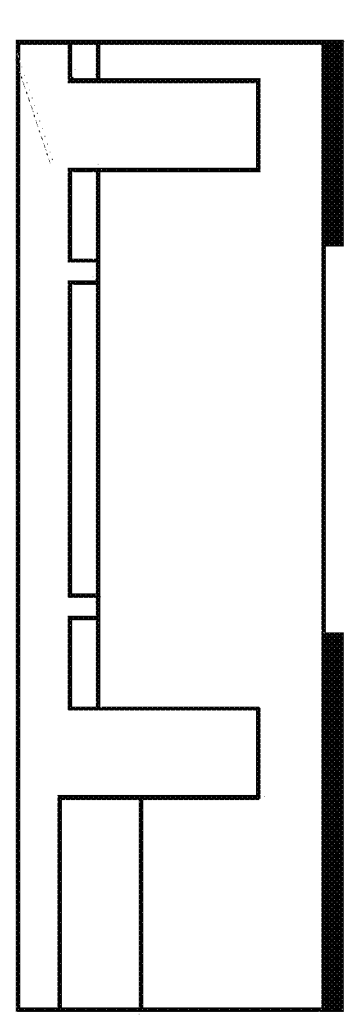

As shown in FIG. 4F, the illustrated process includes depositing a sacrificial layer 419 on the membrane 408 and in the openings 412 in the membrane 408. It is generally desirable that the upper surface of the sacrificial layer 419 be substantially planar. This is because, as discussed below, additional layers are subsequently deposited onto the upper surface of the sacrificial layer 419 and it is desirable that those additional layers be substantially planar. In this regard, up to a certain limit, making the sacrificial layer 419 thicker as is it deposited onto the underlying structures makes the upper surface of the sacrificial layer 419 more planar.

Moreover, it is generally desirable that the sacrificial layer 419 be sufficiently thick that the structures subsequently formed above parts of the sacrificial layer (i.e., the rigid, thermally conductive layer 425 and the absorber 426, see FIG. 4I) are high enough above the membrane 408 and electronic circuit 428 to ensure that the edges of the absorber 426 that will hang over the outer edges of the rigid, thermally conductive layer 425 will not hang down so far as to physically contact any of the underlying structures.

In a typical implementation, the sacrificial layer 419 is deposited onto the underlying structures in at least two steps.

The first step in the two step deposition process may include depositing a diluted and, therefore, lower viscosity, version of the sacrificial layer material onto the underlying structures. The lower viscosity version of the sacrificial layer material may be deposited using any one or more of a variety of different techniques. For example, in one implementation, the lower viscosity version of the sacrificial layer material is deposited onto the underlying structures via a chemical vapor deposition, such as film deposition from a vapor phase, under vacuum.

Typically, the low viscosity of the lower viscosity version of the sacrificial layer material helps ensure that the sacrificial layer material will be able to effectively flow down into the small, high aspect ratio, trench 450 in the substrate 402. In a typical implementation, the trench 450 is only a few microns wide (e.g., 2-3 microns) and 10 or more microns deep. With these dimensions, if the viscosity of the sacrificial layer material is too high, then it could be difficult, if not impossible, to effectively fill the trench 450 with sacrificial layer material.

The second step in the deposition process may include depositing a less diluted (in some instances, not at all diluted) version of the sacrificial layer material. This less diluted version of the sacrificial layer material is deposited on top of the lower viscosity version of the sacrificial layer material. The lower viscosity version of the sacrificial layer material may be deposited using any one or more of a variety of different techniques. For example, in one implementation, the lower viscosity version of the sacrificial layer material is deposited onto the underlying structures via a chemical vapor deposition, such as film deposition from a vapor phase, under vacuum The less diluted version of the sacrificial layer material is deposited in a manner to form a substantially flat upper surface.

Figures 4G, 4H:
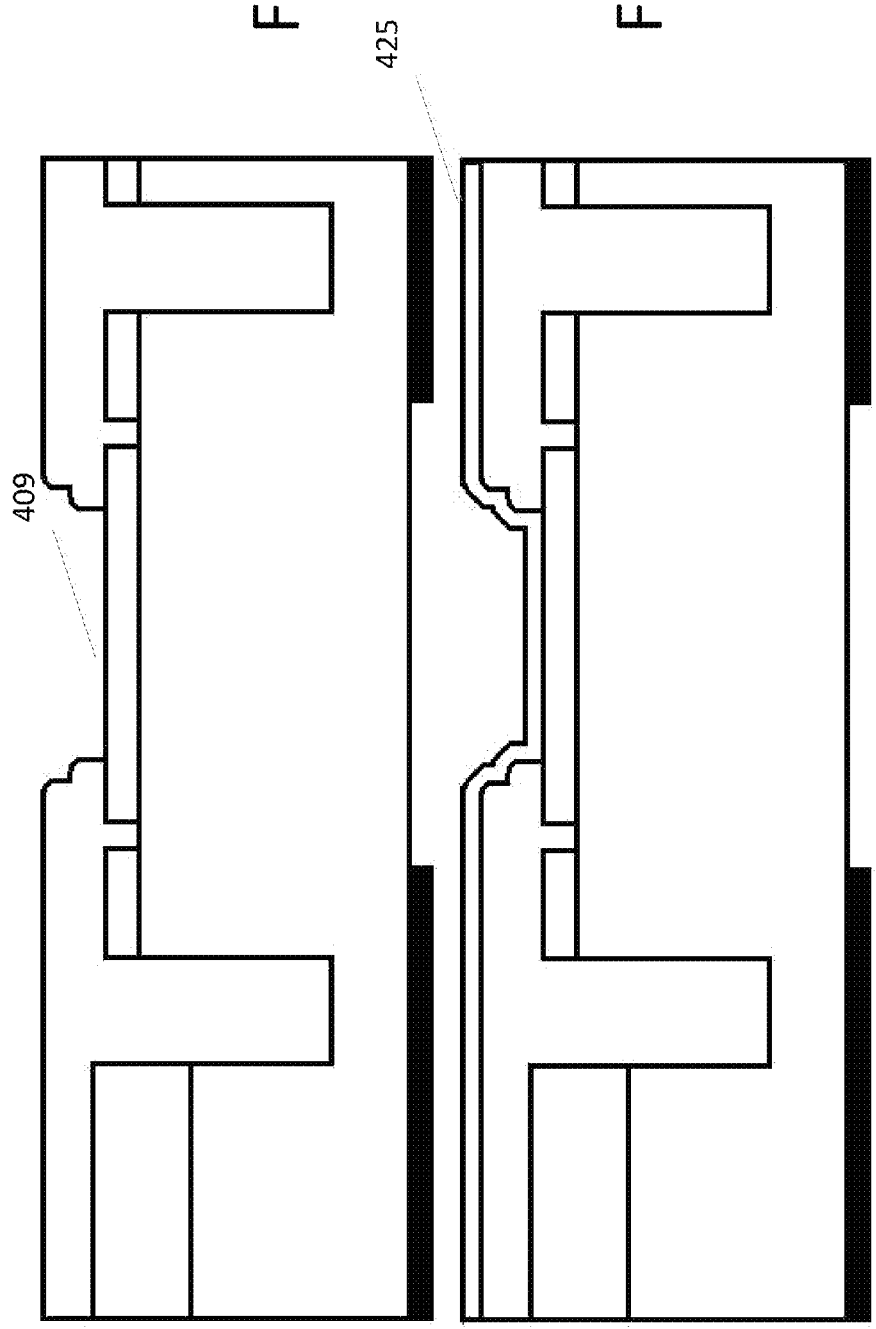

Next, and referring now to FIG. 4G, the process includes patterning the sacrificial layer to expose a portion of the membrane 408 associated with one or more hot junctions of the thermopile. In the illustrated example, the patterning exposes at least part of the platform 409 portion of the membrane 408. More particularly, in the illustrated example, the patterning exposes the central part of the platform, which, in the illustrated example, contains one or more (or all) of the hot junctions of the thermopile.

In a typical implementation, the sacrificial layer 419 may be patterned using a double mask process to create an opening with a side wall that has a stepped configuration (in cross-section). In some implementations, instead of the stepped configuration, the side wall of the opening may have a substantially constant slope from the membrane to the upper surface of the sacrificial layer 419.

Next, according to the illustrated example, and as shown in FIG. 4H, the process includes forming a rigid, thermally-conductive layer 425 on the upper surface of the sacrificial layer and on the exposed portion of the membrane 408, which is associated with (e.g., contains) the one or more hot junctions of the thermopile.

The rigid, thermally-conductive layer 425 can be formed by any low temperature deposition process which does have adverse effects (e.g., either physical or chemical on the structures already present on first (upper) side of the wafer). In a typical implementation, for example, the rigid, thermally-conductive layer 425 is formed by sputtering a metallic material onto the upper surface of the sacrificial layer and onto the exposed portion of the membrane 408.

Figure 4I:
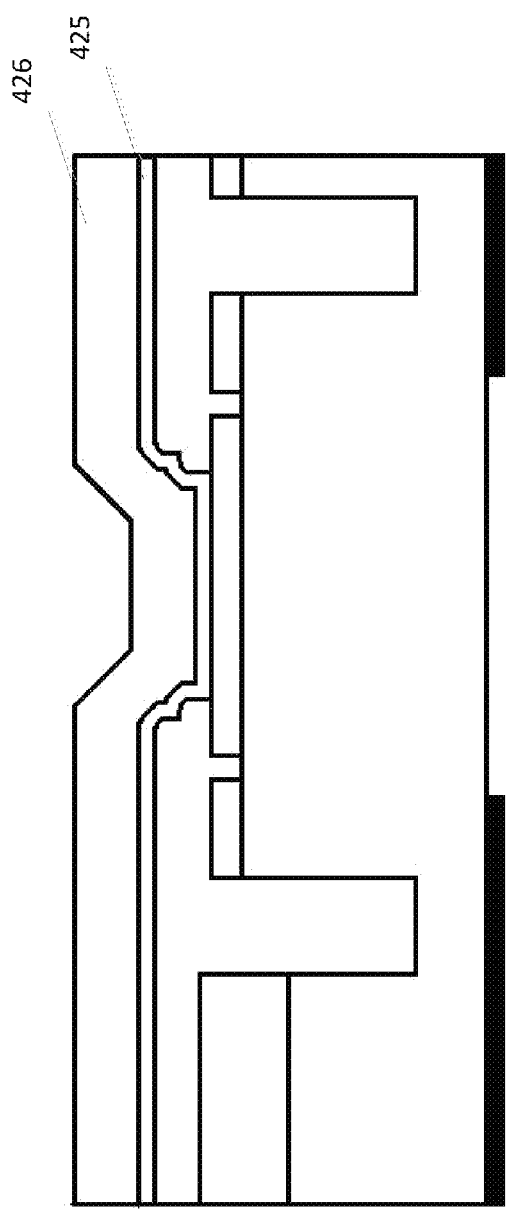

According to FIG. 4I, the process includes depositing the absorber 426 (e.g., by spinning or other processes) onto the upper surface of the rigid, thermally-conductive layer 425. As shown in the illustrated implementation, the absorber 426 substantially follows the contours of the underlying rigid, thermally-conductive layer 425. Typically, the absorber 426 is deposited so as to have a thickness of greater than 3 micrometers.

Figure 4J:
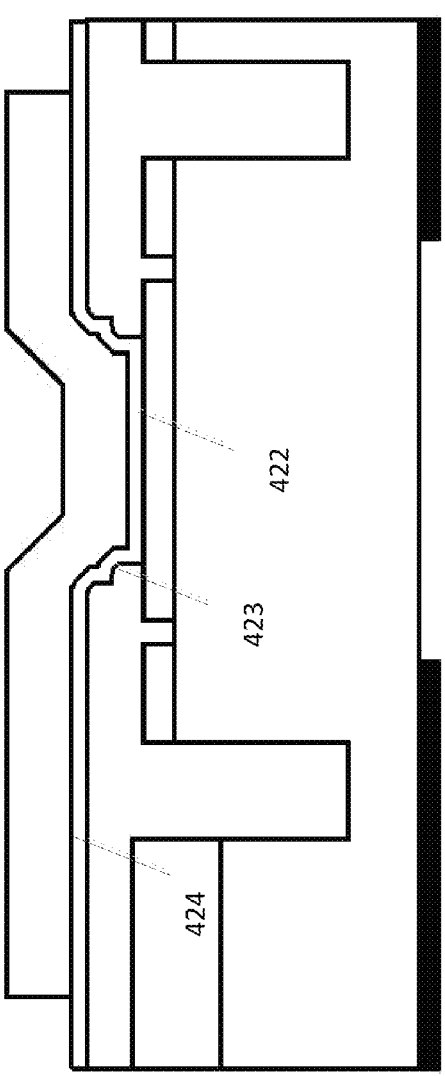

Referring now to FIG. 4J, the process includes patterning the absorber 426. In some implementations, this patterning step is implemented using photolithography, or the like. More particularly, the patterning removes some of the absorber material to leave intact a single contiguous absorber structure for the pixel structure 400.

The single contiguous absorber structure in the illustrated example is in contact with the entire upper surface of the substantially flat base portion 422 of the rigid, thermally-conductive layer 425, the entire upper surface of the transition portion 423 of the rigid, thermally-conductive layer 425 and part of the elevated portion 424. The portions of the single contiguous absorber structure that are in contact with part of the elevated portion 424 after the patterning step extend outward so that its outer edges cover portions of the outer portion 411 of the membrane 408 and the electronic circuit 428.

According to FIG. 4K, the illustrated process includes patterning the rigid, thermally-conductive layer 425. In a typical implementation, the rigid, thermally-conductive layer 425 may be patterned using the patterned absorber as a mask. In the illustrated example, the patterning of the rigid, thermally-conductive layer 425 results in the rigid, thermally-conductive layer 425 having a perimeter that substantially follows, but is slightly undercut relative to, the outer edges of the absorber 426.

Next, at FIG. 4L, the illustrated process includes forming the cavity 414 in the substrate from the lower surface of the substrate 402 to the membrane 408 and out to the sacrificial layer material in the trench 450 at the bottom (i.e., close to the membrane 408) of the cavity 416. In the illustrated example, the cavity 414 is substantially aligned and substantially centered relative to the platform 409 portion of the membrane 408. In addition, the portion of the cavity 414 near the membrane 408 extends outward to the sacrificial layer material in the trench 450 under the legs-portion 410 of the membrane 408.

The cavity 414 may be formed using any one of a variety of techniques. In one example, the cavity 414 is formed using a deep reactive ion etching ("DRIE") technique through the opening in the etch mask 416. The cavity extensions (out to the sacrificial layer material in the trenches 450) may be produced with notching.

Next, as shown in FIG. 4M, the process includes removing the sacrificial layer material.

As illustrated, removing the sacrificial layer material essentially releases the elevated portion of the umbrella structure 420 from other portions of the pixel structure 400. Moreover, removing the sacrificial layer material opens up the trenches 450. In the illustrated implementation, this step includes removing (e.g., by isotropically etching away) the sacrificial layer material as shown. In general, isotropic etching is non-directional removal of material from a substrate via a chemical process using an etchant. The etchant may be, for example, a corrosive liquid or a chemically active ionized gas, known as plasma.

In a typical implementation, the sacrificial layer material is removed from the upper side and from the lower side of the illustrated pixel structure.

A number of embodiments have been described. Nevertheless, it will be understood that various modifications may be made without departing from the spirit and scope of the present disclosure.

For example, specific structural aspects of a pixel structure may be different than what has been described. More particularly, the materials of the various components (e.g., layers, etc.) may be different than what has been specifically described herein. Moreover, the relative and absolute dimensions and positions of the different components described herein may differ from what has been described.

In addition, the processes described herein may be different than what has been described. For example, in various implementations, the order of steps may be changed. Moreover, in some implementations, it may be possible to eliminate one or more of the steps entirely. Specific techniques and materials (e.g., etchants, etc.) described to implement those techniques may differ from what has been disclosed herein.

Relative terms, such as "lower," "upper," "horizontal," "vertical,", "above", "below", "up", "down", "top" and "bottom" as well as derivative thereof (e.g., "horizontally," "downwardly," "upwardly," etc.) should be construed to apply only to certain orientations (e.g., a particular orientation being described or shown in a drawing being discussed). These relative terms are used for convenience only and do not require that the apparatus be constructed or operated in a particular orientation.

Other implementations are within the scope of the claims.

What is claimed is:

1. A method comprising:
providing a substrate with a membrane on a first surface of the substrate,
wherein the membrane has one or more openings that expose one or more portions of the first surface, and includes a thermopile;
depositing a sacrificial layer on the membrane and in the one or more openings;
patterning the sacrificial layer to expose a portion of the membrane associated with one or more hot junctions of the thermopile;
forming a rigid, thermally-conductive layer on the sacrificial layer and on the exposed portion of the membrane associated with the one or more hot junctions of the thermopile;
depositing an absorber on the rigid, thermally-conductive layer;
forming a cavity in the substrate from a second surface of the substrate to the membrane; and
removing the sacrificial layer.

2. The method of claim 1, further comprising:
providing an etching mask on the second surface of the substrate prior to forming the cavity in the substrate.

3. The method of claim 2, wherein forming the cavity in the substrate comprises etching a portion of the substrate exposed through the etching mask, anisotropically.

4. The method of claim 3, wherein forming the cavity in the substrate further comprises:
soft landing the anisotropic etch near the membrane.

5. The method of claim 4, wherein removing the sacrificial layer comprises:
isotropically etching the sacrificial layer,
wherein the isotropic etching removes the sacrificial layer from the one or more openings in the membrane and removes portions of the substrate beneath the one or more openings from the first surface of the substrate to the cavity.

6. The method of claim 5, wherein the isotropic etching is selective, removing the sacrificial layer and the substrate, but not the absorber material; or removing the sacrificial layer but not the substrate and the absorber material.

7. The method of claim 3, further comprising:
forming an etch barrier in the substrate before the anisotropic etching,
wherein the etch barrier surrounds a portion of the substrate that is to be removed by the anisotropic etching.

8. The method of claim 7, wherein the anisotropic etching comprises etching from the second surface of the substrate to the membrane and to the etch barrier.

9. The method of claim 7, wherein forming the etch barrier comprises:
   forming a trench in the first surface of the substrate;
   depositing a passivation layer on the first surface of the substrate and in the trench, wherein the deposited passivation layer substantially conforms to the contours of the first surface of the substrate and the trench in the first surface;
   after depositing the passivation layer, depositing a fill material on the first surface of the substrate and in the trench to thereby create a substantially planar fill material surface;
   removing a portion of the fill material and a portion of the deposited passivation layer to expose a substantially planar surface.

10. The method of claim 9, wherein the passivation layer is a material configured to remain intact when exposed to conditions associated with the anisotropic etching.

11. The method of claim 9, further comprising placing the membrane on the substantially planar surface.

12. The method of claim 9, wherein the etch barrier is a sacrificial layer, and wherein, upon removal of the etch barrier, the trench is contiguous with the cavity.

13. The method of claim 7, wherein removing the sacrificial layer comprises isotropically etching the sacrificial layer, wherein the isotropic etching removes the sacrificial layer from the one or more openings in the membrane.

14. The method of claim 1, further comprising:
   patterning the absorber and the rigid, thermally-conductive layer so that, after the sacrificial layer has been removed, a portion of the absorber and a portion of the rigid, thermally-conductive layer is suspended over corresponding portions of the membrane.

15. The method of claim 1, wherein patterning the sacrificial layer to expose the portion of the membrane comprises:
   forming a step or slope in a side wall of a hole thus formed in the sacrificial layer.

16. The method of claim 1, wherein the absorber has a thickness that is greater than 3 micrometers.

17. The method of claim 1, wherein the membrane is configured to electrically insulate the thermopile from the rigid, thermally-conductive layer.

18. The method of claim 1, wherein the absorber comprises a mixture of one or more organic compounds and one or more inorganic compounds.

19. The method of claim 1, wherein the second surface of the substrate is opposite and substantially parallel to the first surface of the substrate.

20. The method of claim 1, wherein the absorber is protected or configured to remain intact when exposed to conditions associated with removal of the sacrificial layer.

21. The method of claim 1, wherein the sacrificial layer is formed by multiple deposition steps and forms a substantially planar upper surface.

* * * * *